(12) United States Patent
Hollerbach et al.

(10) Patent No.: US 11,599,032 B2
(45) Date of Patent: Mar. 7, 2023

(54) DYNAMIC GENERATION OF LAYOUT ADAPTIVE PACKAGING

(71) Applicant: Applied Materials, Inc., Santa Clara, CA (US)

(72) Inventors: Uwe Hollerbach, Fremont, CA (US); Thomas L. Laidig, Richmond, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 17/285,741

(22) PCT Filed: Aug. 28, 2019

(86) PCT No.: PCT/US2019/048627
§ 371 (c)(1),
(2) Date: Apr. 15, 2021

(87) PCT Pub. No.: WO2020/101786
PCT Pub. Date: May 22, 2020

(65) Prior Publication Data
US 2021/0341849 A1  Nov. 4, 2021

Related U.S. Application Data

(63) Continuation of application No. 16/192,448, filed on Nov. 15, 2018, now Pat. No. 10,678,150.

(51) Int. Cl.
G03F 7/20 (2006.01)
H01L 21/027 (2006.01)

(52) U.S. Cl.
CPC ...... *G03F 7/70991* (2013.01); *G03F 7/70291* (2013.01); *G03F 7/70383* (2013.01); *G03F 7/70508* (2013.01); *H01L 21/0274* (2013.01)

(58) Field of Classification Search
CPC ............ G03F 7/70991; G03F 7/70291; G03F 7/70383; G03F 7/70508; G03F 7/70475;
(Continued)

(56) References Cited

U.S. PATENT DOCUMENTS 4,783,695 A  11/1988 Eichelberger et al.
4,835,704 A  5/1989 Eichelberger et al.
(Continued)

FOREIGN PATENT DOCUMENTS

JP  2004056068 A  2/2004
JP  2004327660 A  11/2004
(Continued)

OTHER PUBLICATIONS

International Search Report and the Written Opinion for International Application No. PCT/US2019/048627 dated Dec. 16, 2019.
(Continued)

*Primary Examiner* — Mesfin T Asfaw
(74) *Attorney, Agent, or Firm* — Patterson & Sheridan, LLP

(57) ABSTRACT

Aspects of disclosure provide a method for attaching wiring connections to a component using both design and field measured data of the component to produce accurate wiring connections.

20 Claims, 9 Drawing Sheets

(58) Field of Classification Search
CPC .............. G03F 7/2051; G03F 7/70358; H01L 21/0274; H01L 21/027
See application file for complete search history.

(56) References Cited

U.S. PATENT DOCUMENTS

| | | | |
|---|---|---|---|
| 5,357,403 | A | 10/1994 | Haller et al. |
| 7,573,052 | B2 | 8/2009 | Inoue et al. |
| 8,799,845 | B2 | 8/2014 | Scanlan et al. |
| 9,418,905 | B2 | 8/2016 | Olson et al. |
| 2001/0034877 | A1 | 10/2001 | Tounai |
| 2005/0145805 | A1 | 7/2005 | Hoefnagels et al. |
| 2006/0066649 | A1 | 3/2006 | Hirashima et al. |
| 2006/0088792 | A1 | 4/2006 | Ishibashi et al. |
| 2006/0177773 | A1 | 8/2006 | Hennig et al. |
| 2008/0052925 | A1 | 3/2008 | Hirashima |
| 2009/0119635 | A1* | 5/2009 | Takahata ............. G03F 1/68 716/51 |
| 2010/0142838 | A1 | 6/2010 | Ivansen et al. |
| 2012/0081682 | A1 | 4/2012 | Ahn |
| 2012/0083916 | A1 | 4/2012 | Kamada et al. |
| 2016/0170311 | A1* | 6/2016 | Schmitt-Weaver ......... G03F 7/70491 355/67 |
| 2016/0238951 | A1 | 8/2016 | White |
| 2016/0282849 | A1 | 9/2016 | Hollerbach et al. |
| 2016/0300767 | A1 | 10/2016 | Ko et al. |
| 2017/0363966 | A1 | 12/2017 | Sasanuma et al. |
| 2018/0329310 | A1 | 11/2018 | Coskun et al. |
| 2019/0047077 | A1 | 2/2019 | Comunale et al. |

FOREIGN PATENT DOCUMENTS

| | | |
|---|---|---|
| JP | 2009014830 A | 1/2009 |
| JP | 2012208237 A | 10/2012 |
| JP | 2013058520 A | 3/2013 |
| KR | 10-2009-0101123 A | 9/2009 |
| KR | 102009010123 A | 9/2009 |
| TW | 201516580 A | 5/2015 |

OTHER PUBLICATIONS

Taiwan Office Action dated Jan. 22, 2022 for Application No. 108131184.

International Search Report/Written Opinion issued to PCT/US2019/048627 dated Dec. 16, 2019.

Japanese Office Action issued to Patent Application No. 2021-525799 dated May 10, 2022.

* cited by examiner

DYNAMIC GENERATION OF LAYOUT ADAPTIVE PACKAGING

BACKGROUND

Field

Embodiments of the present disclosure generally relate to apparatuses, systems and methods for processing one or more substrates, and more specifically to apparatuses, systems and methods for performing photolithography processes. More specifically, aspects of the disclosure relate to adaptive packaging methods and apparatus.

Description of the Related Art

Photolithography is widely used in the manufacturing of semiconductor devices and display devices, such as liquid crystal displays (LCDs). Large area substrates are often utilized in the manufacture of LCDs. LCDs, or flat panels, are commonly used for active matrix displays, such as computers, touch panel devices, personal digital assistants (PDAs), cell phones, television monitors, and the like. Generally, flat panels include a layer of liquid crystal material forming pixels sandwiched between two plates. When power from a power supply is applied across the liquid crystal material, an amount of light passing through the liquid crystal material is controlled at pixel locations enabling images to be generated. Other manufacturing techniques are used to produce organic light emitting diode ("OLED") displays for use in computers, monitors and other systems providing visual output.

Microlithography techniques have been employed to create electrical features incorporated as part of the liquid crystal material layer forming the pixels. According to these techniques, a light-sensitive photoresist is applied to at least one surface of the substrate. Then, a pattern generator exposes selected areas of the light-sensitive photoresist as part of a pattern with light to cause chemical changes to the photoresist in the selective areas to prepare these selective areas for subsequent material removal and/or material addition processes to create the electrical features.

In order to continue to provide display devices and other devices at the prices demanded by consumers, new apparatuses and approaches are needed to precisely and cost-effectively create patterns on substrates, such as large area substrates.

In digital lithography tools, images from a camera are used to find a position of alignment marks so that processing may occur across at a known location. In order to obtain the images, cameras are calibrated and specially chosen for pixel size, orientation (rotation) and uniformity.

One of the major challenges of microlithography systems is placement of wiring between components. Often, arrangements of concern involve a fixed outer periphery to a component placed on an inside of a defined area. Wiring must be placed from the fixed periphery (which may be a connection point to another component) to individual connection points, such as die, of the component on the inside of the defined area.

Placement of the component within this defined area is critical. Generally, the connection wiring from the periphery to the component is fixed (static). If the component is misaligned regarding is intended position in the defined area, then the wiring components will be misaligned when created. Great care must be made such that the component is placed properly and does not shift during processing. Such accurate placement of components is highly problematic and misalignment can occur during processing. The problems that this causes include components produced that are out of specification, to components that do not work altogether. Problems of these sort impact the overall economic viability of the lithography process.

There is a need to allow for creation of wiring systems for components such that the components may be misaligned to a threshold amount during processing.

There is a further need to allow for more rapid processing of components with maskless microlithography systems.

There is a still further need to allow for higher throughput of processing of components with maskless microlithography systems.

There is a still further need to allow for slight deviations in the placement of components in a defined field such that during processing, systems may adapt to the actual processing of components "in-situ" rather than a hypothetical perfect alignment that is difficult to achieve.

SUMMARY

Aspects of disclosure provide a method for attaching wiring connections to a component using both design and field measured data of the component to produce accurate wiring connections.

In one example embodiment, a method for processing an apparatus in a lithography system is disclosed comprising obtaining coordinate data on a component and a connection pattern to the component in a designed state, placing the component within range of at least one scanning device associated with the lithography system, scanning the component with the at least one scanning device to develop a second set of coordinate data for the component, comparing the obtained coordinate data of the component to the second set of coordinate data to determine an offset of the component scanned with the scanning device to the designed state and augmenting the connection pattern to the component based, at least in part, upon one of the offset data, visual images of the scanning of the component used to develop the second set of coordinate data and the second set of coordinate data for the component.

In another example embodiment, a method for processing an apparatus in a microlithography system is disclosed comprising obtaining position data on a component and an electrical connection pattern to the component for a designed state, placing the component on a stage of a microlithography system, placing the stage within range of at least one scanning device of the microlithography system, scanning the stage including the component with the at least one scanning device to develop a second set of coordinate data for the component and the electrical connection pattern, comparing the obtained coordinate data of the component to the second set of coordinate data to determine an offset of the component scanned with the scanning device to the designed state and augmenting the electrical connection pattern to the component based, at least in part, upon the offset data.

In one example embodiment, a method for processing a substrate in a microlithography system is disclosed comprising: obtaining coordinate data in a designed state pertaining to at least one component and at least one wiring connection pattern to the at least one component, wherein the component is at least one of on and in the substrate, placing the substrate on a stage within the microlithography system, moving the substrate on the stage to a scanning device of the lithography system, scanning the substrate including the component with the scanning device to develop a second set of coordinate data for the component, comparing the obtained coordinate data of the component of the stage to the second set of coordinate data to determine an offset of the component scanned with the scanning device to the designed state and augmenting the at least one wiring connection pattern to the component based, at least in part, upon one of the offset data, visual images of the scanning of the component used to develop the second set of coordinate data and the second set of coordinate data for the component.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

In the aspects described below, eye configurations, alignment mark shapes, and cell codes are representative to give an example. There might be any number of eyes and any number of steps to capture alignment mark images. The shape of an alignment mark is not limited by the cross shape. The alignment mark may be any shape. A mark cell code may be implemented by either OCR, shape changes or size changes. The mark cell code can also be embedded to mark itself by changing the thickness of lines or adding additional features to lines. The illustrated embodiments, therefore, are merely descriptive in nature and should not be considered limiting.

Figure 1A:
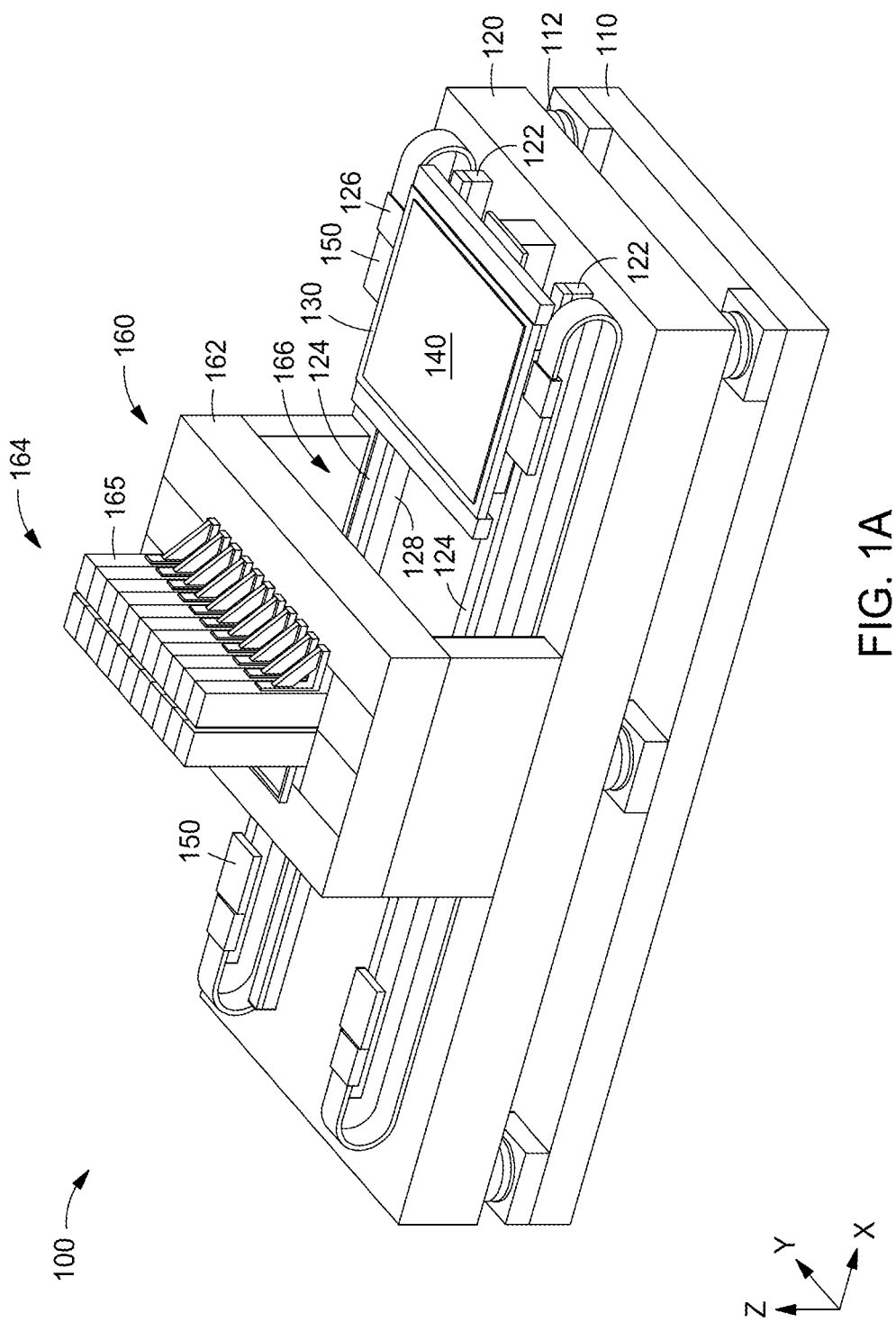
FIG. 1A is a perspective view of a photolithography system according to embodiments disclosed herein.

FIG. 1A is a perspective view of a photolithography system 100 according to embodiments disclosed herein. The system 100 includes a base frame 110, a slab 120, a stage 130, and a processing apparatus 160. The base frame 110 rests on the floor of a fabrication facility and supports the slab 120. Passive air isolators 112 are positioned between the base frame 110 and the slab 120. In one embodiment, the slab 120 is a monolithic piece of granite, and the stage 130 is disposed on the slab 120. A substrate 140 is supported by the stage 130. A plurality of holes (not shown) are formed in the stage 130 for allowing a plurality of lift pins (not shown) to extend therethrough. In some embodiments, the lift pins rise to an extended position to receive the substrate 140, such as from one or more transfer robots (not shown). The one or more transfer robots are used to load and unload a substrate 140 from the stage 130.

The substrate 140 comprises any suitable material, for example, quartz used as part of a flat panel display. In other embodiments, the substrate 140 is made of other materials. In some embodiments, the substrate 140 has a photoresist layer formed thereon. A photoresist is sensitive to radiation. A positive photoresist includes portions of the photoresist, which when exposed to radiation, will be respectively soluble to photoresist developer applied to the photoresist after the pattern is written into the photoresist. A negative photoresist includes portions of the photoresist, which when exposed to radiation, will be respectively insoluble to photoresist developer applied to the photoresist after the pattern is written into the photoresist. The chemical composition of the photoresist determines whether the photoresist will be a positive photoresist or negative photoresist. Examples of photoresists include, but are not limited to, at least one of diazonaphthoquinone, a phenol formaldehyde resin, poly (methyl methacrylate), poly(methyl glutarimide), and SU-8. In this manner, the pattern is created on a surface of the substrate 140 to form the electronic circuitry.

The system 100 includes a pair of supports 122 and a pair of tracks 124. The pair of supports 122 are disposed on the slab 120, and the slab 120 and the pair of supports 122 are a single piece of material. The pair of tracks 124 is supported by the pair of the supports 122, and the stage 130 moves along the tracks 124 in the X-direction. In one embodiment, the pair of tracks 124 is a pair of parallel magnetic channels. As shown, each track 124 of the pair of tracks 124 is linear. In other embodiments, one or more track 124 is non-linear. An encoder 126 is coupled to the stage 130 in order to provide location information to a controller (not shown).

The processing apparatus 160 includes a support 162 and a processing unit 164. The support 162 is disposed on the slab 120 and includes an opening 166 for the stage 130 to pass under the processing unit 164. The processing unit 164 is supported by the support 162. In one embodiment, the processing unit 164 is a pattern generator configured to expose a photoresist in a photolithography process. In some embodiments, the pattern generator is configured to perform a maskless lithography process. The processing unit 164 includes a plurality of image projection apparatus (shown in FIGS. 2A and 2B). In one embodiment, the processing unit 164 contains as many as 84 image projection apparatus. Each image projection apparatus is disposed in a case 165. The processing apparatus 160 is useful to perform maskless direct patterning.

During operation, the stage 130 moves in the X-direction from a loading position, as shown in FIG. 1A, to a processing position. The processing position is one or more positions of the stage 130 as the stage 130 passes under the processing unit 164. During operation, the stage 130 is be lifted by a plurality of air bearings (not shown) and moves along the pair of tracks 124 from the loading position to the processing position. A plurality of vertical guide air bearings (not shown) are coupled to the stage 130 and positioned adjacent an inner wall 128 of each support 122 in order to stabilize the movement of the stage 130. The stage 130 also moves in the Y-direction by moving along a track 150 for processing and/or indexing the substrate 140. The stage 130 is capable of independent operation and can scan a substrate 140 in one direction and step in the other direction.

A metrology system measures the X and Y lateral position coordinates of each of the stage 130 in real time so that each of the plurality of image projection apparatus can accurately locate the patterns being written in a photoresist covered substrate. The metrology system also provides a real-time measurement of the angular position of each of the stage 130 about the vertical or Z-axis. The angular position measurement can be used to hold the angular position constant during scanning by means of a servo mechanism or it can be used to apply corrections to the positions of the patterns being written on the substrate 140 by the image projection apparatus 270, shown in FIGS. 2A-2B. These techniques may be used in combination.

Figure 1B:
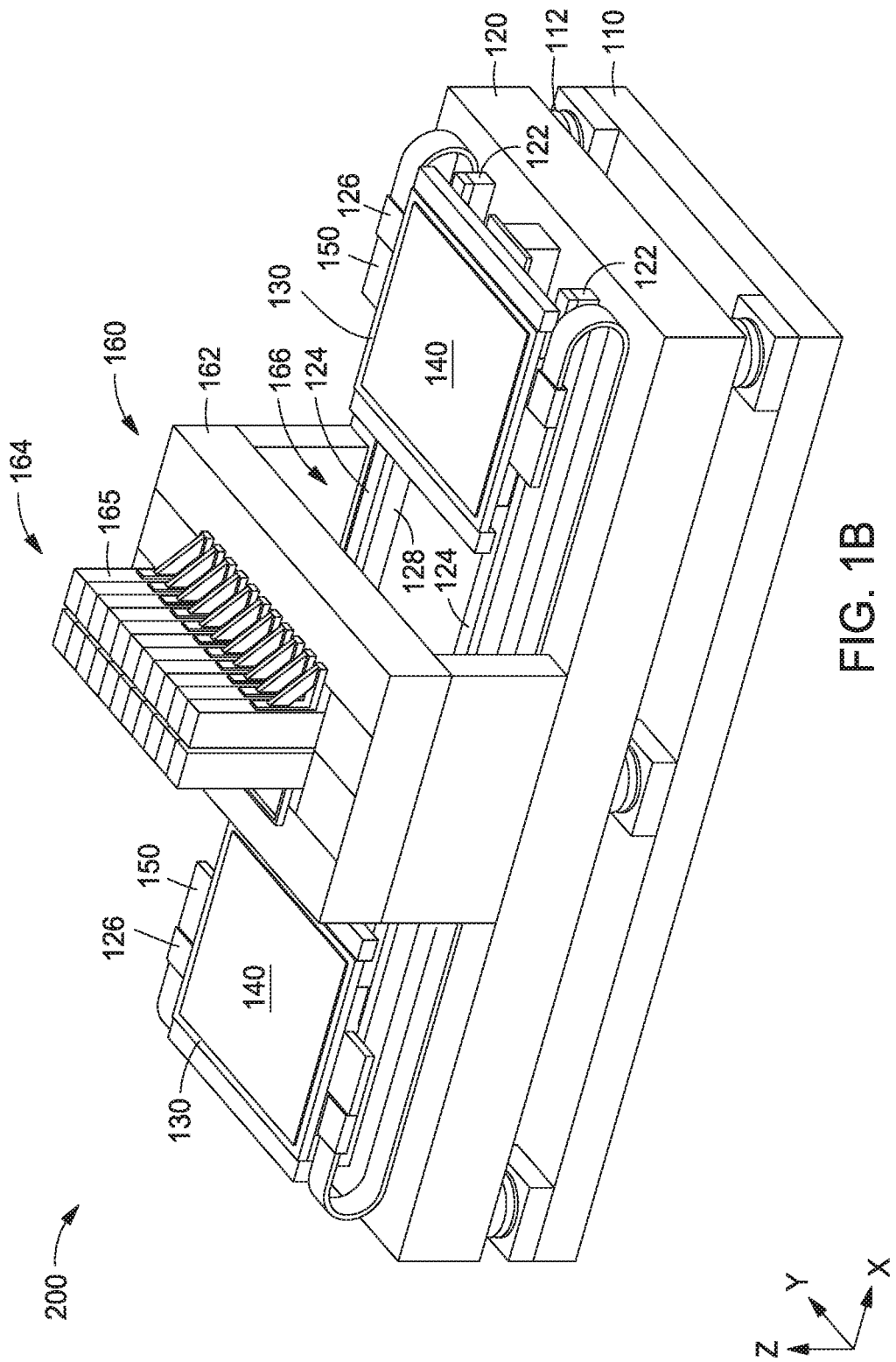
FIG. 1B is a perspective view of a photolithography system according to embodiments disclosed herein.

FIG. 1B is a perspective view of a photolithography system 200 according to embodiments disclosed herein. The system 200 is similar to the system 100; however, the system 200 includes two stages 130. Each of the two stages 130 is capable of independent operation and can scan a substrate 140 in one direction and step in the other direction. In some embodiments, when one of the two stages 130 is scanning a substrate 140, another of the two stages 130 is unloading an exposed substrate and loading the next substrate to be exposed.

While FIGS. 1A-1B depict two embodiments of a photolithography system, other systems and configurations are also contemplated herein. For example, photolithography systems including any suitable number of stages are also contemplated.

Figure 2A:
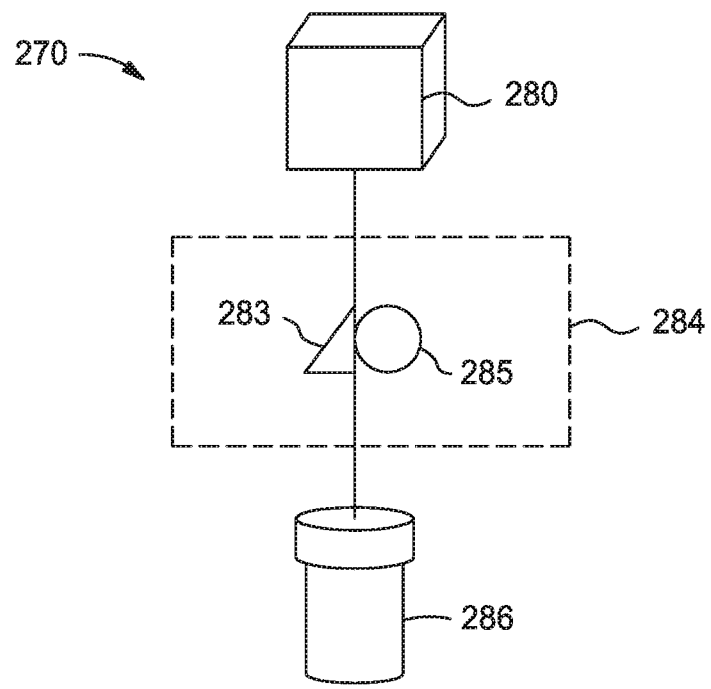
FIG. 2A is a perspective schematic view of an image projection apparatus according to embodiments disclosed herein.

FIG. 2A is a perspective schematic view of an image projection apparatus 270 according to one embodiment, which is useful for a photolithography system, such as system 100 or system 200. The image projection apparatus 270 includes one or more spatial light modulators 280, an alignment and inspection system 284 including a focus sensor 283 and a camera 285, and projection optics 286. The components of image projection apparatus vary depending on the spatial light modulator being used. Spatial light modulators include, but are not limited to, microLEDs, digital micromirror devices (DMDs) and liquid crystal displays (LCDs).

In operation, the spatial light modulator 280 is used to modulate one or more properties of the light, such as amplitude, phase, or polarization, which is projected through the image projection apparatus 270 and to a substrate, such as the substrate 140. The alignment and inspection system 284 is used for alignment and inspection of the components of the image projection apparatus 270. In one embodiment, the focus sensor 283 includes a plurality of lasers which are directed through the lens of the camera 285 and the back through the lens of the camera 285 an imaged onto sensors to detect whether the image projection apparatus 270 is in focus. The camera 285 is used to image the substrate, such as substrate 140, to ensure the alignment of the image projection apparatus 270 and photolithography system 100 or 200 is correct or within an predetermined tolerance. The projection optics 286, such as one or more lenses, is used to project the light onto the substrate, such as the substrate 140.

Figure 2B:
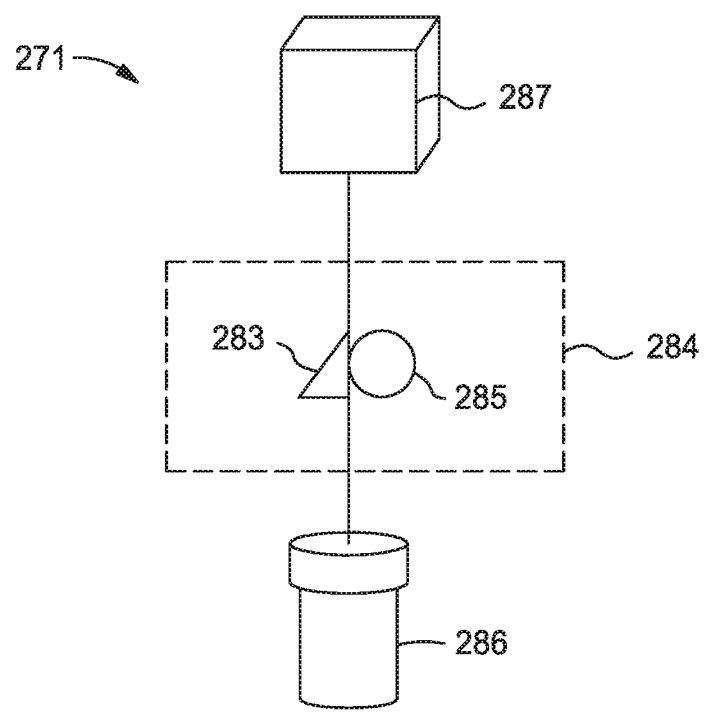
FIGS. 2B and 2C are perspective schematic views of an image projection apparatus according to embodiments disclosed herein.

FIG. 2B is an image project apparatus 271 according to embodiments described herein. In the embodiment shown in FIG. 2B, the image projection apparatus 271 includes one or more microLEDs 287 as the spatial light modulator(s), a focus sensor 283, camera 285, and projection optics 286. In one embodiment, the image projection apparatus 271 further includes a beamsplitter (not shown). MicroLEDs are microscopic (for example, less than about 100 µm) light emitting diodes, which may be arranged in an array and used to form the individual pixels of a substrate, such as a display device. MicroLEDs include inorganic materials, such as an inorganic Gallium Nitride (GaN) material. Since microLEDs are self-emitting, an outside light source is not needed in the image projection apparatus 271.

In embodiments using microLEDs, the camera 285 is also useful to measure the image pixel pitch of the one or more microLEDs to calibrate for any thermal expansion happening at the microLED device.

Figure 2C:
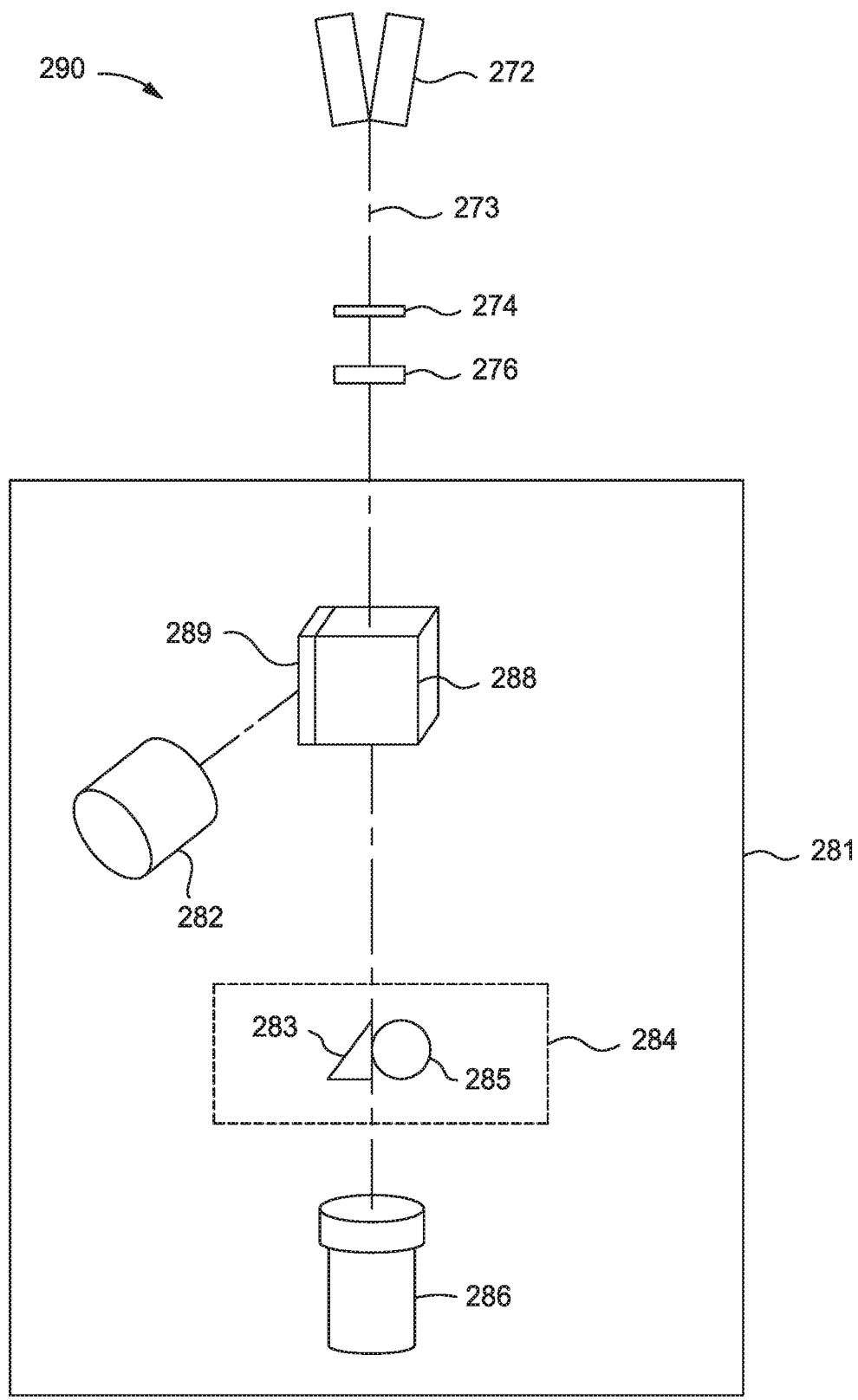

FIG. 2C is an image project apparatus 281 according to embodiments described herein. In the embodiment shown in FIG. 2B, the image projection apparatus 281 uses one or more DMDs 289 as the spatial light modulator(s). The image projection apparatus 281 is part of an image projection system 290, which includes a light source 272, an aperture 274, a lens 276, a frustrated prism assembly 288, one or more DMDs 289 (one is shown), and a light dump 282, in addition to the alignment and inspection system 284 and the projection optics 286. The light source 272 is any suitable light source, such as a light emitting diode (LED) or a laser, capable of producing a light having predetermined wavelength. In one embodiment, the predetermined wavelength is in the blue or near ultraviolet (UV) range, such as less than about 450 nm. The frustrated prism assembly 288 includes a plurality of reflective surfaces. The projection optics 286 is, as an example, a 10× objective lens. During operation of the image projection apparatus 281 shown in FIG. 2C, a light beam 273 having a predetermined wavelength, such as a wavelength in the blue range, is produced by the light source 272. The light beam 273 is reflected to the DMD 289 by the frustrated prism assembly 288. The DMD includes a plurality of mirrors, and the number of mirrors corresponds to the number of pixels to be projected. The plurality of mirrors are individually controllable, and each mirror of the plurality of mirrors is at an "on" position or "off" position, based on the mask data provided to the DMD 289 by the controller (not shown). When the light beam 273 reaches the mirrors of the DMD 289, the mirrors that are at "on" position reflect the light beam 273, i.e., forming the plurality of write beams, to the projection optics 286. The projection optics 286 then projects the write beams to the surface of the substrate 140. The mirrors that are at "off" position reflect the light beam 273 to the light dump 282 instead of the surface of the substrate 140.

In processing of materials through the lithography system, components with one or more dice are placed on a stage for processing. While an ideal layout of the components may be achieved for processing, various factors may impact such ideal layout. Processing speed of the lithography system may slightly move the components as the lithography system handles the components. These slight movements, for components that are small, can have drastic impact on the final product as wiring from an origination point to ending point can be small. Each component, furthermore, may have several dice, therefore many connections may be impacted by incorrect alignment of the component compared to a "perfect" or ideal layout.

Aspects of the disclosure provide that given an ideal placement of one or more dice within a packaging layout as well as actual placements that may involve some errors, the ideal placement may be modified or distorted to match the actual placements, thereby adaptively generating routing for packaging of dice into a larger assembly.

Figure 3:
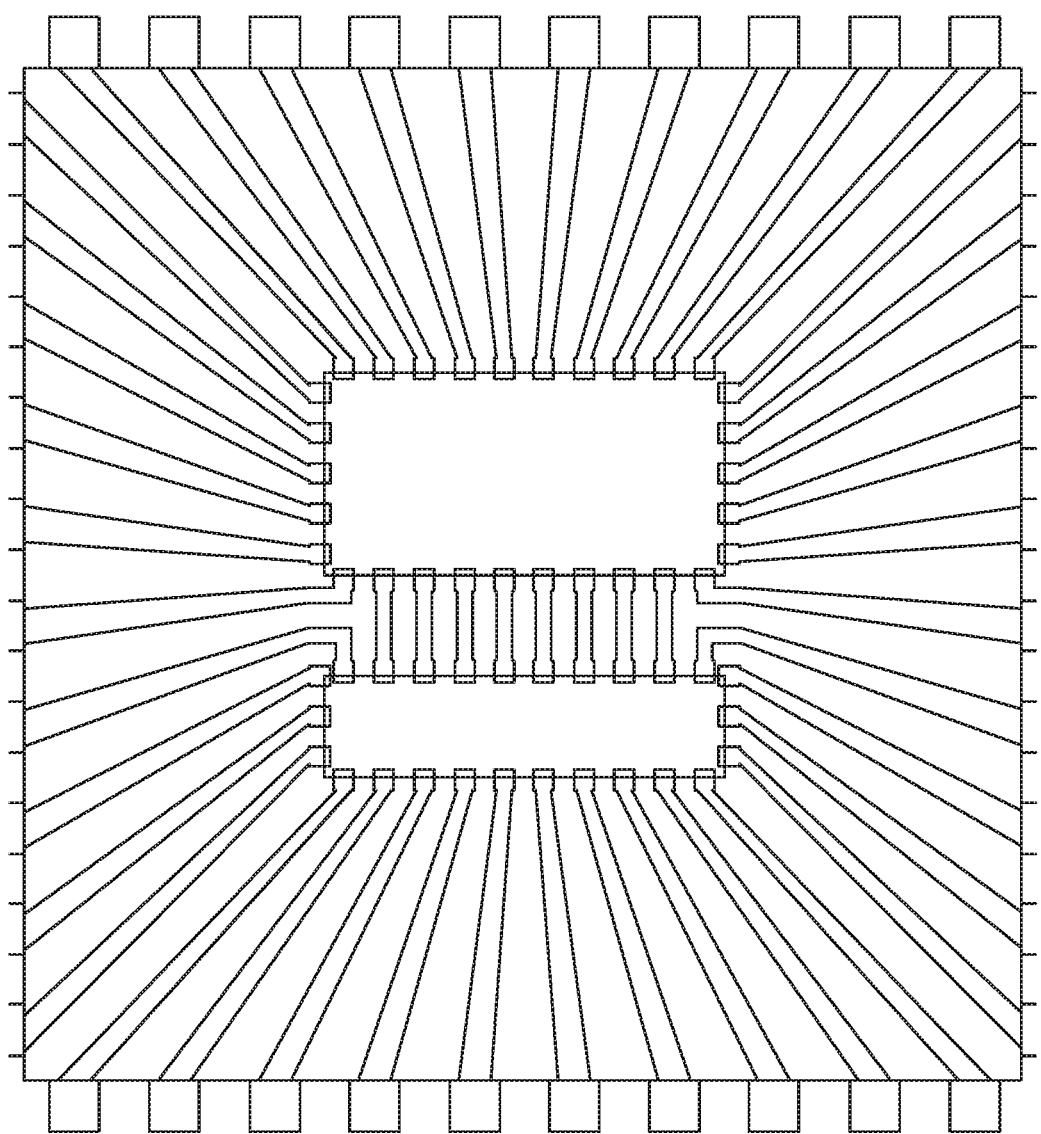
FIG. 3 is a schematic depiction of a device with hypothetical connections.

Referring to FIG. 3, an ideal layout plot is provided. Such ideal layout plot would occur if each of the components is placed, as intended, on a substrate for processing. As will be understood, placement of components with extremely high accuracy can be difficult. To this end, even if the component is placed with high accuracy, shifting may occur during processing, as digital lithography systems move large substrates at fast speeds.

Figure 4:
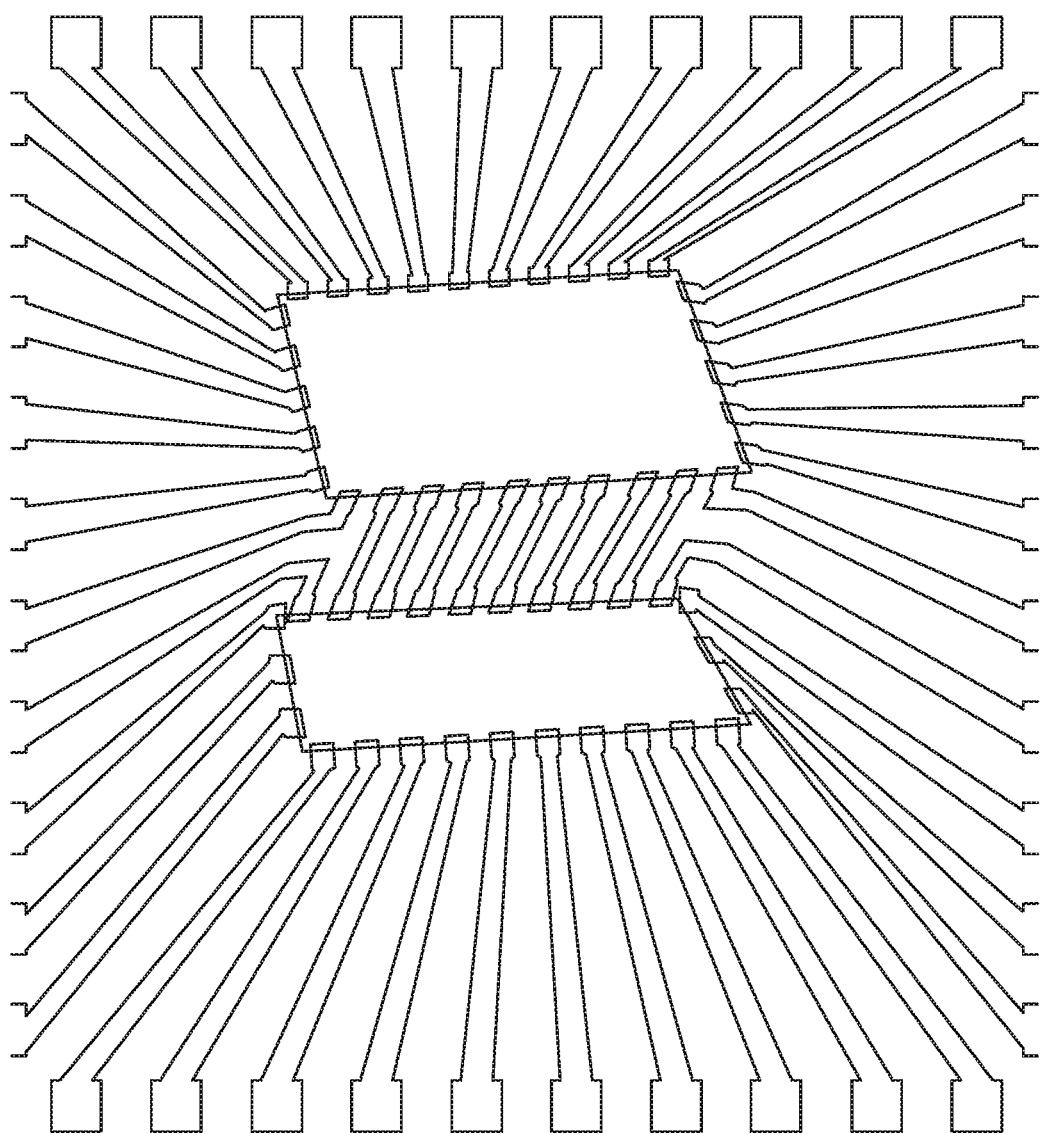
FIG. 4 is a schematic depiction of the device of FIG. 3 in an augmented position with modified wiring connections.

Referring to FIG. 4, an actual layout plot is provided of a component. As can be seen, the component is shifted from the position in FIG. 3. An altered wiring connection to the component is therefore required in order for the component to operate correctly. To this end an augmented wiring scheme is produced such that the wiring is proper.

Figure 5:
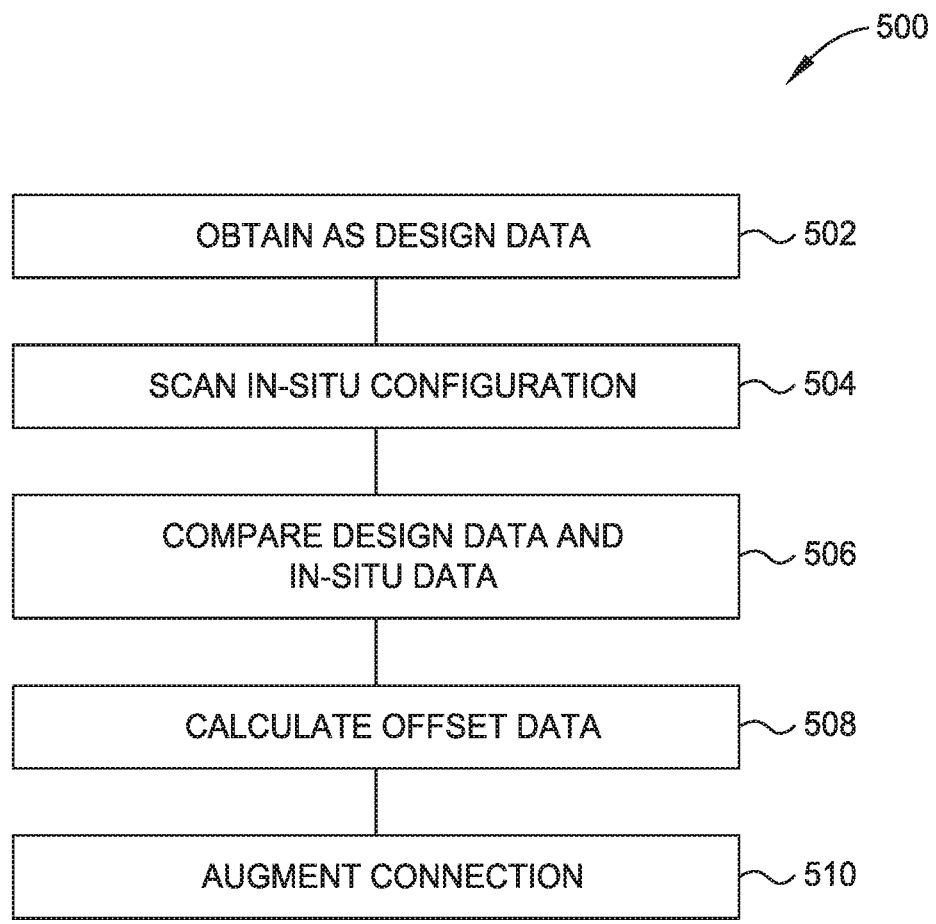
FIG. 5 is a method of creating a wiring connection to a device.

Referring to FIG. 5, a method 500 for processing an apparatus in a lithography system is illustrated. In a first step data may be obtained, such as coordinate data on a component as well as a connection pattern to the component in a designed state 502. This data may be obtained from manufacturing drawings, for example. The component may be any type of component that needs wiring attachment, such as, but not limited by, processors. Wiring may be, for example, from the component to a fixed external area, such that when components are eventually separated, the wiring ends at a predetermined location.

As can be understood, the component is positioned within a defined field for processing. The actual (x,y) components may vary slightly from various factors, including the ability of locating such components accurately during initial processing of the platen (indexing table) before loading of the platen into the microlithography machine. Other factors may also cause the component to move, such as handling of the components during microlithography steps. To achieve a wiring connection to the component that extends to the fixed outer field, the "in-situ" positioning of the components on the platen are scanned with at least one scanning device to be able to ascertain the exact positioning of each component 504. The platen, therefore, is moved into a position in the lithography system such that the scanning occurs for processing of coordinate data. As will be understood, scanning of the actual condition may also be accomplished by a separate process, if needed, and the data fed to the microlithography machine for use. The data obtained, a second set of data, may be stored, if required. The second set of coordinate data may be compared to the obtained coordinate data ("the as designed data") to determine any offsets that may present in the actual placement of the components compared to the ideal-designed positioning 506. An offset may be calculated in 508 to allow the microlithography machine to understand the exact placement of the components. The connection pattern from the ideal designed condition may then be augmented using data from the offset calculation, for example 510. As will be understood, visual image data may also be used to determine the difference that is needed for the connection pattern.

Computer analysis of the data may be performed to determine the required offset. The computer analysis may not only calculate the offset, but also provide new connection wiring locations between the component and the fixed perimeter, therefore speeding processing.

In embodiments, hardware architects may determine that slight variations from ideal placement are allowable. The deviation for the wiring connection and the component may be determined to be within acceptable levels. In those instances, no alteration of the wiring connection may be required.

When deviations from these acceptable levels are found, a warning may be generated to the processors to allow for notification that alterations/modification of the wiring are necessary. In other embodiments, if the location and orientation of the components is outside of a maximum threshold, connections cannot be effectively made to the component. A separate warning may be made to the processors that the components are out of tolerance and that even with modification of the wiring connection, such connections will be compromised.

As will be understood, designs for wiring connections may take into account not only placement accuracy of the starting and ending points of the connection, but also wiring connection length. If a length of wire would be too long for effective operation and would cause, for example, excessive latency, then a warning may be generated to the processor that such wiring, if produced, would be out of specification. In the embodiments, connections are understood to mean electrical connections that are established with a component, such as a die of a microprocessor.

Figure 6:
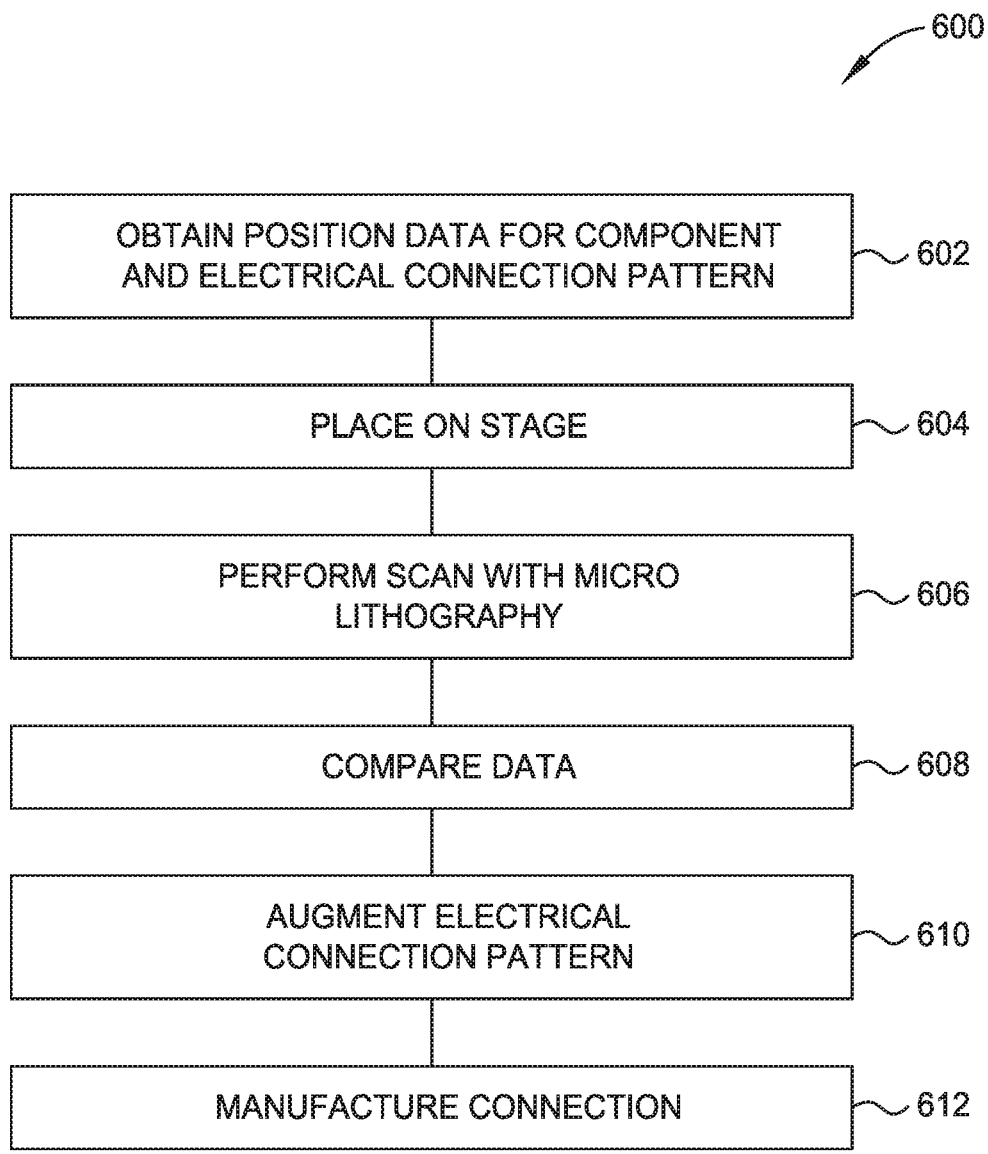
FIG. 6 is a second method of creating a wiring connection to a device.

Referring to FIG. 6, a method 600 for processing an apparatus in a microlithography system is disclosed. In one embodiment, position data is obtained on a component and an electrical connection pattern to the component for a designed state 602. Next, at 604, the component is placed on a stage of a microlithography system. At 606, the stage is scanned including the component with the at least one scanning device to develop a second set of coordinate data for the component and the electrical connection pattern. At 608, the obtained coordinate data of the component is compared to the second set of coordinate data to determine an offset of the component scanned with the scanning device to the designed state. At 610, the electrical connection pattern to the component based is augmented, at least in part, upon the offset data. At 612, the electrical connection pattern is manufactured.

Figure 7:
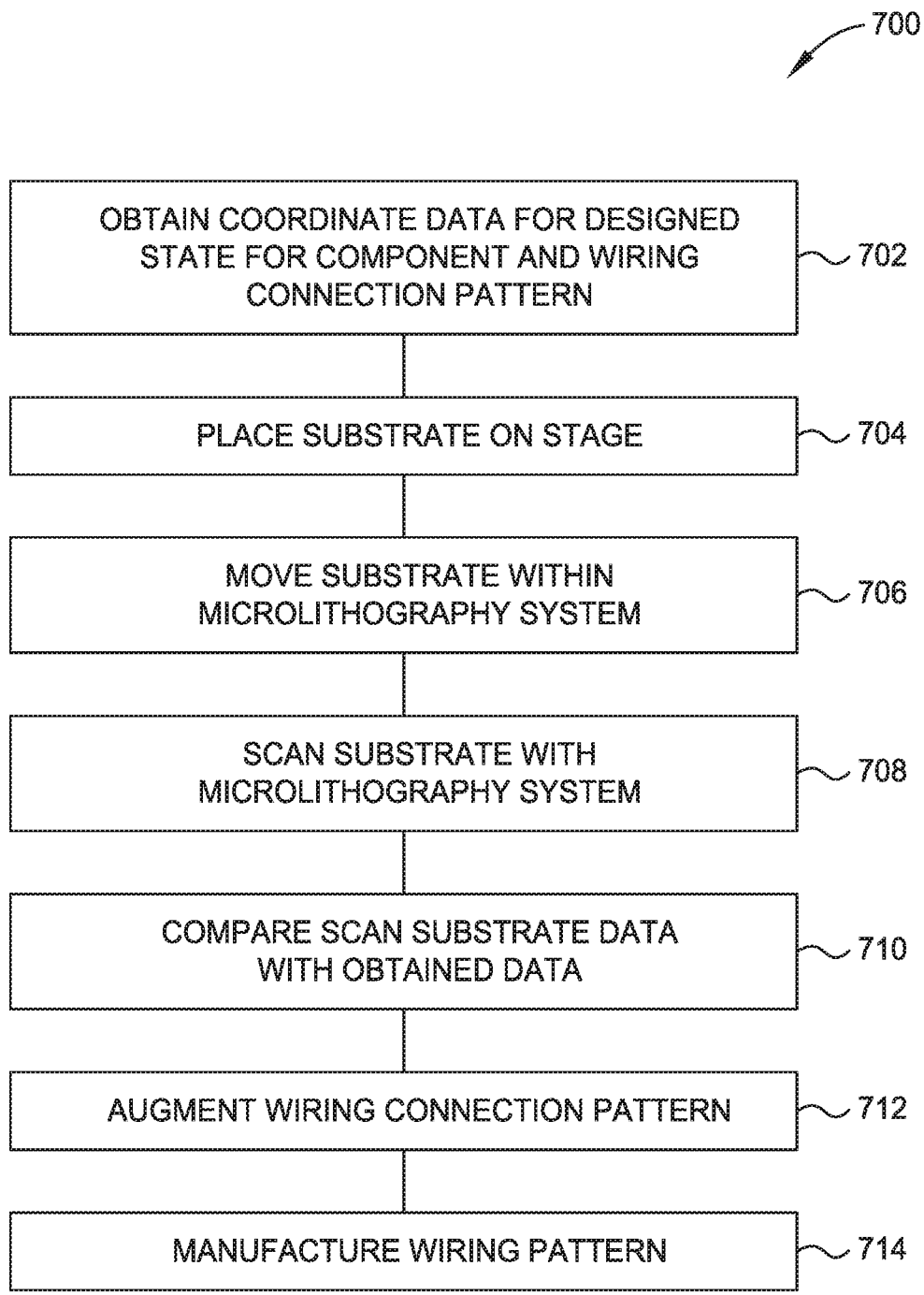
FIG. 7 is a third method of creating a wiring connection to a device.

Referring to FIG. 7, a method 700 for processing a substrate in a microlithography system is disclosed. In one embodiment, coordinate data is obtained 702 for a designed state pertaining to at least one component and at least one wiring connection pattern to the at least one component, wherein the component is at least one of on and in the substrate. At 704, the method continues with placing the substrate on a stage within the microlithography system. The method then continues with moving the substrate on the stage to a scanning device of the lithography system at 706. At 708, the method continues with scanning the substrate including the component with the scanning device to develop a second set of coordinate data for the component. At 710, the method continues with comparing the obtained coordinate data of the component of the stage to the second set of coordinate data to determine an offset of the component scanned with the scanning device to the designed state. The method then continues at 712 with augmenting the at least one wiring connection pattern to the component based, at least in part, upon one of the offset data, visual images of the scanning of the component used to develop the second set of coordinate data and the second set of coordinate data for the component. At 714, the at least one wiring connection pattern is manufactured.

In one example embodiment, a method for processing an apparatus in a lithography system is disclosed comprising obtaining coordinate data on a component and a connection pattern to the component in a designed state, placing the component within range of at least one scanning device associated with the lithography system, scanning the component with the at least one scanning device to develop a second set of coordinate data for the component, comparing the obtained coordinate data of the component to the second set of coordinate data to determine an offset of the component scanned with the scanning device to the designed state and augmenting the connection pattern to the component based, at least in part, upon one of the offset data, visual images of the scanning of the component used to develop the second set of coordinate data and the second set of coordinate data for the component.

In another non-limiting embodiment, the method may be performed wherein the component is placed upon a substrate.

In another non-limiting embodiment, the method may be performed wherein the substrate is placed upon an indexing table of the lithography system.

In another non-limiting embodiment, the method may be performed wherein the augmenting of the connection pattern is performed by computer analysis.

In another non-limiting embodiment, the method may be performed wherein the comparing the obtained coordinate data to the second set of coordinate data further comprises comparing the offset to a threshold.

In another non-limiting embodiment, the method may be further comprised when the offset is less than the threshold, setting the offset to zero.

In another non-limiting embodiment, the method may further comprise comparing the obtained coordinate data to the second set of coordinate data further comprises comparing the offset to a threshold and when the comparing is greater than the threshold, generating a warning to a user that the threshold has been exceeded.

In another non-limiting embodiment, the method may further comprise manufacturing the connection pattern based upon data of the augmented connection pattern.

In another example embodiment, a method for processing an apparatus in a microlithography system is disclosed comprising obtaining position data on a component and an electrical connection pattern to the component for a designed state, placing the component on a stage of a microlithography system, placing the stage within range of at least one scanning device of the microlithography system, scanning the stage including the component with the at least one scanning device to develop a second set of coordinate data for the component and the electrical connection pattern, comparing the obtained coordinate data of the component to the second set of coordinate data to determine an offset of the component scanned with the scanning device to the designed state and augmenting the electrical connection pattern to the component based, at least in part, upon the offset data.

In one example embodiment, the method may further comprise manufacturing the connection pattern based upon data of the augmented connection pattern.

In another example embodiment, the method may be performed wherein the component is placed upon a substrate.

In another example embodiment, the method may be performed wherein the augmenting of the connection pattern is performed by computer analysis.

In another example embodiment, the method may be performed wherein the comparing the obtained coordinate data to the second set of coordinate data further comprises comparing the offset to a threshold.

In another example embodiment, the method may be performed wherein the microlithography system is a maskless system.

In another example embodiment, the method may be performed wherein the comparing the obtained coordinate data to the second set of coordinate data further comprises comparing the offset to a threshold.

In one example embodiment, a method for processing a substrate in a microlithography system is disclosed comprising obtaining coordinate data in a designed state pertaining to at least one component and at least one wiring connection pattern to the at least one component, wherein the component is at least one of on and in the substrate, placing the substrate on a stage within the microlithography system, moving the substrate on the stage to a scanning device of the lithography system, scanning the substrate including the component with the scanning device to develop a second set of coordinate data for the component, comparing the obtained coordinate data of the component of the stage to the second set of coordinate data to determine an offset of the component scanned with the scanning device to the designed state and augmenting the at least one wiring connection pattern to the component based, at least in part, upon one of the offset data, visual images of the scanning of the component used to develop the second set of coordinate data and the second set of coordinate data for the component.

In another example embodiment, the method may further comprise manufacturing the at least one wiring connection pattern based upon data of the augmented connection pattern.

In another example embodiment, the method may be performed wherein the augmenting of the connection pattern is performed by computer analysis.

In a still further example embodiment, the method may be performed wherein the comparing the obtained coordinate data to the second set of coordinate data further comprises comparing the offset to a threshold.

While embodiments have been described herein, those skilled in the art, having benefit of this disclosure will appreciate that other embodiments are envisioned that do not depart from the inventive scope of the present application. Accordingly, the scope of the present claims or any subsequent related claims shall not be unduly limited by the description of the embodiments described herein.

What is claimed is:

1. A method for processing an apparatus in a maskless lithography system, comprising:
   obtaining coordinate data on a component and an aspect of an electrical connection to the component in a designed state;
   placing the component within range of at least one scanning device associated with the lithography system;
   scanning the component with the at least one scanning device to develop a second set of coordinate data for the component;
   comparing the obtained coordinate data of the component to the second set of coordinate data for the component to determine an offset of the component scanned with the scanning device to the designed state;
   altering the aspect of the electrical connection to the component based, at least in part, upon one of the offset data, visual images of the scanning of the component used to develop the second set of coordinate data for the component, and the second set of coordinate data for the component prior to the forming the electrical connection;

providing an electrical connection wiring location between the component and a fixed perimeter using the altered aspect of the electrical connection; and forming an altered electrical connection on the electrical connection location between the component and the fixed perimeter, wherein the method is performed in-situ in the maskless lithography system.

2. The method according to claim 1, wherein the component is placed upon a substrate, and wherein the substrate is placed upon an indexing table of the lithography system.

3. The method according to claim 1, wherein the altering the aspect of the electrical connection is performed by computer analysis.

4. The method according to claim 1, wherein the comparing the obtained coordinate data to the second set of coordinate data further comprises comparing the offset to a threshold.

5. The method according to claim 4, further comprising: when the offset is less than the threshold, setting the offset to zero.

6. The method according to claim 1, further comprising: comparing the obtained coordinate data to the second set of coordinate data further comprises comparing the offset to a threshold; and when the comparing is greater than the threshold, generating a warning to a user that the threshold has been exceeded.

7. The method according to claim 1, further comprising: manufacturing the electrical connection based upon data of the aspect of the electrical connection that is altered.

8. The method according to claim 1, wherein the altering the aspect of the electrical connection is based upon the offset data.

9. The method according to claim 1, wherein the component is placed upon a substrate.

10. A method for processing an apparatus in a maskless microlithography system, comprising:

obtaining position data on a component and an aspect of an electrical connection to the component for a designed state;

placing the component on a stage of a microlithography system;

placing the stage within range of at least one scanning device of the microlithography system;

scanning the stage including the component with the at least one scanning device to develop a second set of coordinate data for the component and the electrical connection;

comparing the obtained coordinate data of the component to the second set of coordinate data for the component to determine an offset of the component scanned with the scanning device to the designed state;

altering the aspect of the electrical connection to the component based, at least in part, upon the offset data prior to forming the electrical connection;

providing an electrical connection wiring location between the component and a fixed perimeter using the altered aspect of the electrical connection; and forming the altered electrical connection on the electrical connection location between the component and the fixed perimeter, wherein the method is performed in-situ in the maskless lithography system.

11. The method according to claim 10, further comprising:

manufacturing the electrical connection based upon data of the aspect of the electrical connection that is altered.

12. The method according to claim 10, wherein the component is placed upon a substrate.

13. The method according to claim 10, wherein the altering of the aspect of the electrical connection is performed by computer analysis, or wherein the comparing the obtained coordinate data to the second set of coordinate data further comprises comparing the offset to a threshold.

14. The method according to claim 10, wherein the microlithography system is a maskless system, or wherein the comparing the obtained coordinate data to the second set of coordinate data further comprises comparing the offset to a threshold.

15. The method according to claim 10, wherein the aspect of the electrical connection is performed by computer analysis.

16. The method according to claim 10, wherein the microlithography system is a maskless system.

17. A method for processing a substrate in a maskless microlithography system, comprising:

obtaining coordinate data in a designed state pertaining to at least one component and an aspect of at least one wiring connection to the at least one component, wherein the component is at least one of on and in the substrate;

placing the substrate on a stage within the microlithography system;

moving the substrate on the stage to a scanning device of the lithography system;

scanning the substrate including the component with the scanning device to develop a second set of coordinate data for the component;

comparing the obtained coordinate data of the component of the stage to the second set of coordinate data for the component to determine an offset of the component scanned with the scanning device to the designed state;

altering the aspect of the at least one wiring connection to the component based, at least in part, upon one of the offset data, visual images of the scanning of the component used to develop the second set of coordinate data for the component and the second set of coordinate data for the component prior to forming the electrical connection;

providing an electrical connection wiring location between the component and a fixed perimeter using the altered aspect of the electrical connection; and forming the altered electrical connection on the electrical connection location between the component and the fixed perimeter, wherein the method is performed in-situ in the maskless lithography system.

18. The method according to claim 17, further comprising:

manufacturing the at least one wiring connection pattern based upon data of the aspect of the at least one wiring connection pattern.

19. The method according to claim 17, wherein the altering the aspect of the at least one wiring connection is performed by computer analysis, or wherein the comparing the obtained coordinate data to the second set of coordinate data further comprises comparing the offset to a threshold, or wherein the component is a semiconductor component.

20. The method according to claim 17, wherein the altering the aspect of the at least one wiring connection is based upon the offset data.

\* \* \* \* \*